United States Patent
Sturni et al.

(10) Patent No.: US 6,671,950 B2
(45) Date of Patent: Jan. 6, 2004

(54) MULTI-LAYER CIRCUIT ASSEMBLY AND PROCESS FOR PREPARING THE SAME

(75) Inventors: Lance C. Sturni, Allison Park, PA (US); Kevin C. Olson, Gibsonia, PA (US)

(73) Assignee: PPG Industries Ohio, Inc., Cleveland, OH (US)

(*) Notice: Subject to any disclaimer, the term of this patent is extended or adjusted under 35 U.S.C. 154(b) by 16 days.

(21) Appl. No.: 09/901,373

(22) Filed: Jul. 9, 2001

(65) Prior Publication Data

US 2002/0125040 A1 Sep. 12, 2002

Related U.S. Application Data

(63) Continuation-in-part of application No. 09/851,904, filed on May 9, 2001, which is a continuation-in-part of application No. 09/802,001, filed on Mar. 8, 2001.

(51) Int. Cl.$^7$ ................................................ H01K 3/10
(52) U.S. Cl. ............................ 29/852; 29/846; 29/848; 427/551; 427/96
(58) Field of Search ............................ 29/852, 846, 830, 29/831, 848; 427/97, 551, 555, 556, 96, 99; 156/630, 645

(56) References Cited

U.S. PATENT DOCUMENTS

| | | | |
|---|---|---|---|
| 3,469,982 A | 9/1969 | Celeste | 430/256 |
| 3,738,835 A | 6/1973 | Bakos | 430/286.1 |
| 4,343,885 A | 8/1982 | Reardon, Jr. | 430/270.1 |
| 4,378,264 A | 3/1983 | Pilette et al. | 156/238 |
| 4,592,816 A | 6/1986 | Emmons et al. | 204/478 |
| 5,153,986 A | * 10/1992 | Brauer et al. | 29/846 |
| 5,224,265 A | 7/1993 | Dux et al. | 29/852 |

(List continued on next page.)

FOREIGN PATENT DOCUMENTS

WO    WO 98/20559    5/1998

OTHER PUBLICATIONS

"Parylene Specifications and Properties", Speedline Technologies, product literature, 2000.

(List continued on next page.)

*Primary Examiner*—Gregory Vidovich
*Assistant Examiner*—Stephen Kenny
(74) *Attorney, Agent, or Firm*—Deborah M. Altman; William J. Uh

(57) ABSTRACT

A process for fabricating a multi-layer circuit assembly is provided comprising the following steps:

(a) providing a perforate electrically conductive core having a via density of 500 to 10,000 holes/square inch (75 to 1550 holes/square centimeter);

(b) applying a dielectric coating onto all exposed surfaces of the electrically conductive core to form a conformal coating on all exposed surfaces of the electrically conductive core;

(c) ablating the surface of the dielectric coating in a predetermined pattern to expose sections of the electrically conductive core;

(d) applying a layer of metal to all surfaces to form metallized vias through the electrically conductive core; and (e) applying a resinous photosensitive layer to the metal layer.

Additional processing steps such as circuitization may be included.

Also provided are multi-layer circuit assemblies produced by the process of the present invention, comprising component layers having high via density and thermal coefficients of expansion that are compatible with those of semiconductor chips and rigid wiring boards which may be attached as components of the circuit assembly.

26 Claims, 2 Drawing Sheets

U.S. PATENT DOCUMENTS

| | | | | |
|---|---|---|---|---|
| 5,229,550 A | * | 7/1993 | Bindra et al. | 174/262 |
| 5,232,548 A | * | 8/1993 | Ehrenberg et al. | 216/18 |
| 5,242,780 A | | 9/1993 | Lin et al. | 430/190 |
| 5,285,571 A | * | 2/1994 | Gorczyca et al. | 29/848 |
| 5,291,066 A | | 3/1994 | Neugebauer et al. | 257/750 |
| 5,298,685 A | | 3/1994 | Bindra et al. | 174/250 |
| 5,316,787 A | | 5/1994 | Frankeny et al. | 427/97 |
| 5,319,158 A | | 6/1994 | Lee et al. | 174/250 |
| 5,590,460 A | | 1/1997 | DiStefano et al. | 29/830 |
| 5,600,035 A | | 2/1997 | Kahle et al. | 568/932 |
| 5,879,808 A | | 3/1999 | Wary et al. | 428/411.1 |
| 6,105,243 A | * | 8/2000 | Okabe et al. | 29/830 |
| 6,150,284 A | | 11/2000 | Kawahara | 438/780 |
| 6,266,874 B1 | * | 7/2001 | DiStefano et al. | 29/846 |
| 6,365,844 B2 | * | 4/2002 | Nishii et al. | 174/264 |
| 6,427,325 B1 | * | 8/2002 | Johansson et al. | 29/852 |
| 6,434,819 B1 | * | 8/2002 | Rokugawa | 29/852 |

OTHER PUBLICATIONS

Beach, W.F., "Xylylene Polymers", *Kirk–Othmer Encyclopedia of Chemical Technology*, Supplement Volume, pp. 863–901, 1998.

* cited by examiner

MULTI-LAYER CIRCUIT ASSEMBLY AND PROCESS FOR PREPARING THE SAME

CROSS-REFERENCE TO RELATED APPLICATION

This patent application is a continuation-in-part of U.S. patent application Ser. No. 09/851,904, filed May 9, 2001, which is a continuation-in-part of U.S. patent application Ser. No. 09/802,001, filed Mar. 8, 2001.

FIELD OF THE INVENTION

The present invention relates to the field of electronic circuitry, and in particular to multi-layer circuit assemblies such as chip scale packages, and the preparation thereof.

BACKGROUND OF THE INVENTION

An electronic circuit package, or assembly, comprises many individual components including, for example, resistors, transistors, capacitors, etc. These components are interconnected to form circuits, and circuits are likewise interconnected to form units having specific functions. In microelectronic circuit packages, circuits and units are prepared in packaging levels of increasing scale. The smallest scale packaging levels are typically semiconductor chips housing multiple microcircuits and/or other components. Such chips are usually made from ceramics, silicon, and the like. Intermediate package levels ("chip carriers") comprising multi-layer substrates may have attached thereto a plurality of small-scale chips housing many microelectronic circuits. In turn, these intermediate package levels are themselves attached to larger scale circuit cards, motherboards, and the like. The intermediate package levels serve several purposes in the circuit assembly including structural support, transitional integration of the smaller scale microcircuits and circuits to larger scale boards, and the dissipation of heat from the circuit assembly.

Substrates used in conventional intermediate package levels have included ceramic, fiberglass reinforced polyepoxides, and polyimides. These substrates, while offering sufficient rigidity to provide structural support to the circuit assembly, typically have thermal coefficients of expansion much different than that of the microelectronic chips being attached thereto. As a result, failure of the circuit assembly after repeated use is a risk due to failure of adhesive joints between the layers of the assembly.

Likewise, dielectric materials used on the substrates must meet several requirements, including conformality and flame resistance. Moreover, as circuit packages are being designed to operate at ever higher frequencies, dielectric materials must be highly effective (i.e., they must have dielectric constants as low as possible that do not degrade) in order to prevent crosstalk in the package. Conventional dielectrics include polyimides, polyepoxides, phenolics, and fluorocarbons.

U.S. Pat. Nos. 5,224,265 and 5,232,548 disclose methods of fabricating multi-layer thin-film wiring structures for use in circuit assemblies. The dielectric applied to the core substrate is preferably a fully cured and annealed thermoplastic polymer such as polytetrafluoroethylene, polysulfone, or polyimide-siloxane, preferably applied by lamination. Such dielectrics are not necessarily applied as conformal coatings, and may not have dielectric constants or dissipation factors low enough to accommodate the high frequencies of circuit systems currently being designed for the electronics market today. Moreover, dielectric properties of conventional dielectric coatings have been known to degrade at high frequencies. Additionally, while the references disclose through holes ("vias") in the wiring structures, there is no appreciation in the references of the need for a relatively high via density. High via density allows for a high number of chip connections, as may be required in a highly functional chip scale package for applications such as cellular phones and the like.

It should be noted that high via density in a circuit layer is critical for the operation of a circuit system having a high number of chip connections; however, high via density also contributes to crosstalk. Therefore, a circuit package designed with high via density needs to be fabricated using a very effective dielectric that does not degrade at high frequencies.

U.S. Pat. No. 5,153,986 discloses a method of fabricating metal core layers for a multi-layer circuit board. Suitable dielectrics include vapor-depositable conformal polymeric coatings. The method uses solid metal cores and the reference describes in broad, generic terms circuitization of the substrate. Circuitization of intermediate package levels is conventionally performed by applying a positive- or negative-acting photoresist to the metallized substrate, followed by exposure, development, and stripping to yield a desired circuit pattern. Photoresist compositions are typically applied by laminating, spraying, or immersion. The photoresist layer thus applied may have a thickness of 5 microns to 50 microns.

In addition to the ceramic, fiberglass reinforced polyepoxides, and polyimides mentioned above, conventional substrates used in intermediate package levels further include solid metal sheets such as are disclosed in U.S. Pat. No. 5,153,986. These solid substrates must be perforated during fabrication of the circuit assembly to provide through holes for alignment purposes. Again, while the reference discloses vias in the circuit layers, there is no appreciation of the need for a relatively high via density to accommodate highly functionalized chips.

In view of the prior art processes, it would be desirable to provide a process for preparing a multi-layer circuit assembly that overcomes the drawbacks of the prior art. That is, it would be desirable to provide a process for preparing a multi-layer circuit assembly with high via density to accommodate highly functional components, using a very effective dielectric that does not degrade at high frequencies and meets further requirements including conformality and flame resistance.

SUMMARY OF THE INVENTION

It is an object of the present invention to provide a multi-layer circuit assembly and a process for preparing it, such that the final assembly comprises component layers having thermal coefficients of expansion that are compatible with those of smaller and larger scale components which may be attached to the circuit assembly.

It is a further object of the present invention to provide high via density, allowing for more electrical interconnects from highly functional chips to level two packages.

Additional objects of the present invention include superior dielectric performance and fine line resolution to provide for advanced chip attachment techniques.

In accordance with the present invention, a process for fabricating a multi-layer circuit assembly is provided comprising the following steps:

(a) providing a perforate electrically conductive core having a via density of 500 to 10,000 holes/square inch (75 to 1550 holes/square centimeter);

(b) applying a dielectric coating onto all exposed surfaces of the electrically conductive core to form a conformal coating on all exposed surfaces of the electrically conductive core;

(c) ablating the surface of the dielectric coating in a predetermined pattern to expose sections of the electrically conductive core;

(d) applying a layer of metal to all surfaces to form metallized vias through the electrically conductive core; and (e) applying a resinous photosensitive layer to the metal layer.

Also provided is a multi-layer circuit assembly prepared by the process of the present invention, comprising:

(a) a perforate electrically conductive core having a via density of 500 to 10,000 holes/square inch (75 to 1550 holes/square centimeter);

(b) a dielectric coating applied onto all exposed surfaces of the electrically conductive core, and ablated in a predetermined pattern to expose sections of the electrically conductive core;

(c) a layer of metal applied to all surfaces, thereby forming metallized vias through the electrically conductive core; and (d) a resinous photosensitive layer applied to the metal layer.

DETAILED DESCRIPTION

Figure 1:
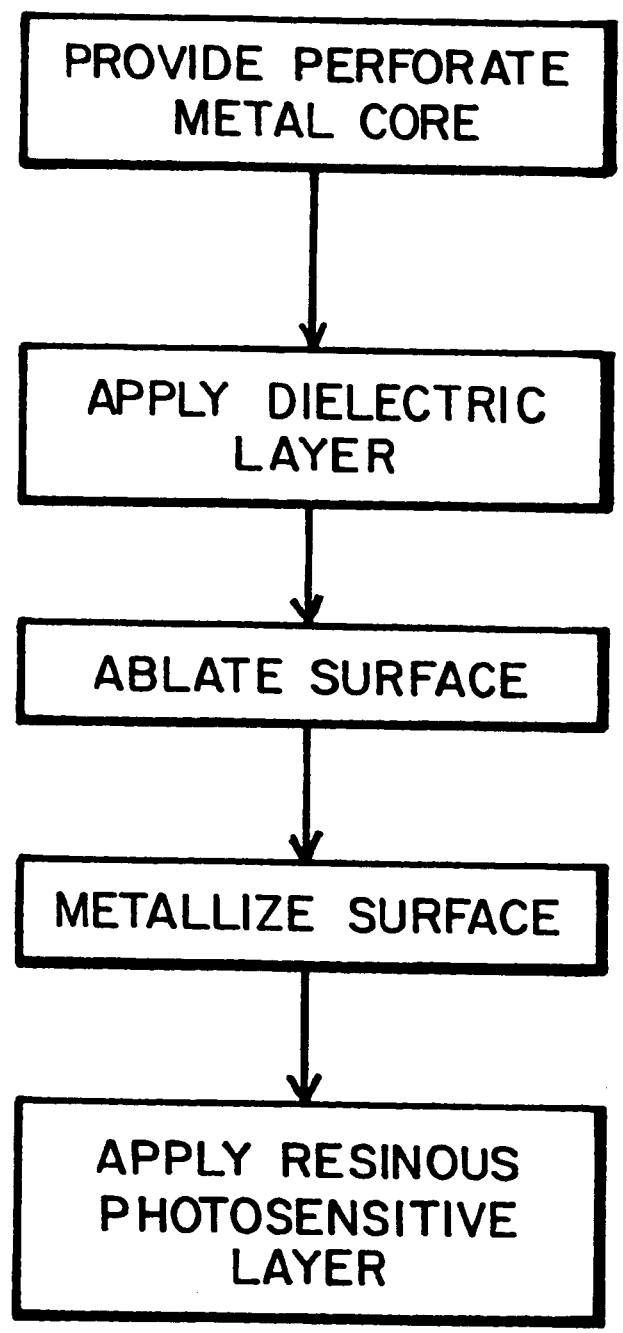
FIG. 1 is a flow chart depicting an embodiment of the process of the invention.
Figure 2:
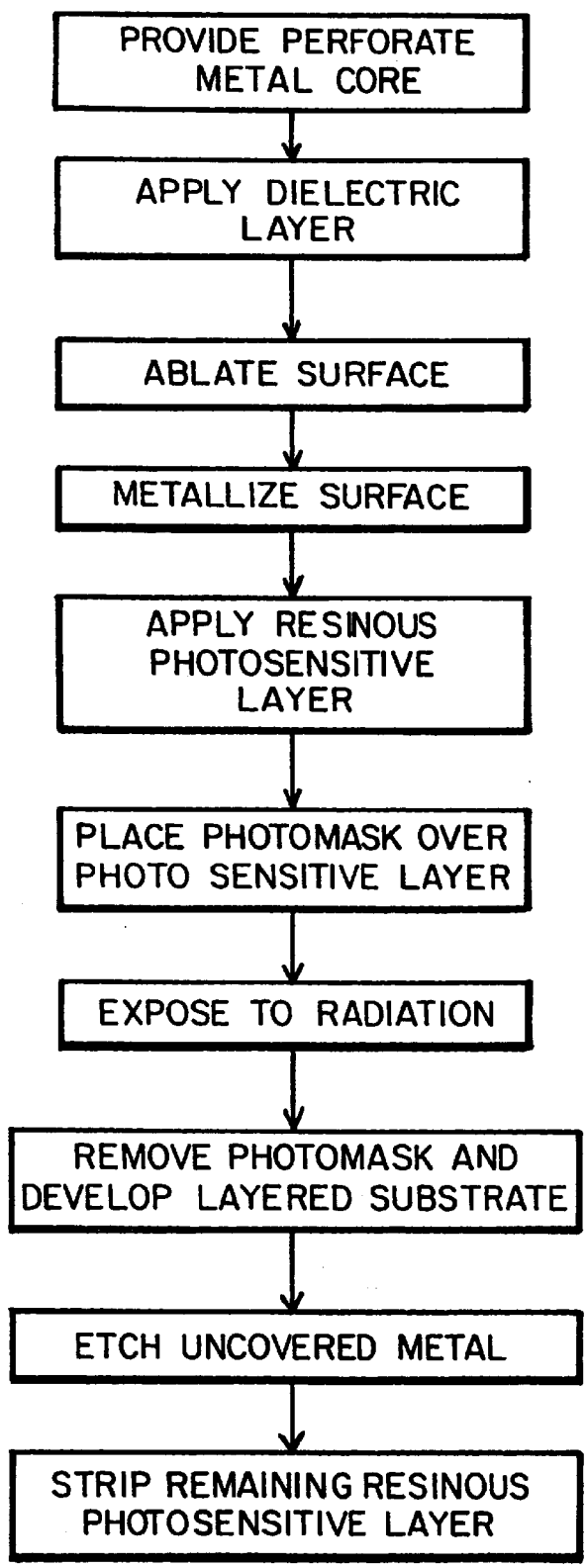
FIG. 2 is a flow chart depicting an additional embodiment of the present invention, including circuitization of the multi-layer assembly.

The process of the present invention for fabricating a multi-layer circuit assembly comprises the following steps:

(a) providing a perforate electrically conductive core having a via density of 500 to 10,000 holes/square inch (75 to 1550 holes/square centimeter);

(b) applying a dielectric coating to all exposed surfaces of the electrically conductive core to form a conformal coating on all exposed surfaces of the electrically conductive core;

(c) ablating the surface of the dielectric coating in a predetermined pattern to expose sections of the electrically conductive core;

(d) applying a layer of metal to all surfaces thereby forming metallized vias through the electrically conductive core; and (e) applying a resinous photosensitive layer to the metal layer.

In a separate embodiment, the process of the present invention for fabricating a multi-layer circuit assembly comprises the following steps: (a) through (e) as above;

(f) placing a photo-mask having a desired pattern over the photosensitive layer to form a layered substrate with selected exposed portions;

(g) exposing the layered substrate to a suitable actinic radiation source;

(h) removing the photo-mask and developing the layered substrate to remove more soluble portions of the photosensitive layer from the underlying metal layer and to uncover selected areas of the metal layer;

(i) etching any uncovered metal to remove it from the underlying dielectric coating; and (j) stripping the remaining resinous photosensitive layer to provide a circuit pattern connected by the metallized vias formed in step (d). The process may include one or more other optional steps, as discussed below, with the same results and without departing from the scope of the invention. Likewise, the order in which the steps of the process are performed may be changed as necessary without departing from the scope of the invention.

The substrate used in the process to prepare the multi-layer circuit assembly of the present invention is a perforate electrically conductive core having a thickness of about 15 to 250 microns, preferably 25 to 100 microns. By "perforate electrically conductive core" is meant an electrically conductive mesh sheet having a plurality of holes spaced at regular intervals. Typically the holes are of uniform size and shape. When the holes are circular, which is typical, the diameter of the holes is about 8 mil (203.2 microns). The holes may be larger or smaller as necessary, with the proviso that a hole is large enough to accommodate all the layers applied in the process of the present invention without becoming obstructed. The spacing of the holes is about 20 mils (508 microns) center-to-center, but again may be larger or smaller as necessary. Via density may range from 500 to 10,000 holes/square inch (75 to 1550 holes/square centimeter), preferably about 2500 holes/square inch (387.5 holes/square centimeter).

Suitable substrates to be used as the core are any electrically conductive materials. For example, suitable metals include copper foil, iron-nickel alloys, and combinations thereof. A preferred iron-nickel alloy is Invar, (trademark owned by Imphy S. A., 168 Rue de Rivoli, Paris, France) comprising approximately 64 weight percent iron and 36 weight percent nickel. This alloy has a low coefficient of thermal expansion, comparable to that of silicon materials used to prepare chips. This property is desirable in order to prevent failure of adhesive joints between successively larger or smaller scale layers of a chip scale package, due to thermal cycling during normal use. When a nickel-iron alloy is used as the electrically conductive core, a layer of copper metal is preferably applied to all surfaces of the electrically conductive core to ensure optimum conductivity. The layer of copper metal may be applied by conventional means, such as electroplating or metal vapor deposition. The layer of copper typically has a thickness of from 1 to 8 microns.

A dielectric coating is applied to all exposed surfaces of the electrically conductive core to form a conformal coating. As a conformal coating, the dielectric is of substantially uniform thickness, typically about 5 to 50 microns on all exposed surfaces of the metal core. The dielectric coating preferably has a dielectric constant of less than about 4.00, more preferably less than about 3.00, with a dissipation factor less than about 0.04. The dielectric coating used in the process of the present invention may be applied by any conformal coating method including, for example, vapor deposition and electrodeposition. Examples of dielectric coatings applied by vapor deposition include poly-(para-xylylenes)(encompassing both substituted and unsubstituted poly-(para-xylylene)); silsesquioxanes, such as those disclosed in U.S. Pat. Nos. 5,711,987 and 6,144,106; poly-benzocyclobutene and polyimide. Examples of dielectric coatings applied by electrodeposition include anodic and cathodic acrylic, epoxy, polyester, polyurethane, polyimide or oleoresinous compositions, as known to those skilled in the art. After application of the dielectric coating, the surface of the dielectric coating is ablated in a predetermined pattern to expose sections of the electrically conductive core. Such ablation is typically performed using a laser or by other conventional techniques.

Prior to application of the dielectric, the electrically conductive core surface may be pretreated or otherwise prepared for the application of the dielectric. For example, cleaning, rinsing, and/or treatment with an adhesion promoter prior to application of the dielectric may be appropriate.

Metallization is performed after the ablation step by applying a layer of metal to all surfaces, allowing for the formation of metallized vias through the core perforations. Alternatively, metallization may be performed before the ablation step, with additional metallization performed afterward if necessary Suitable metals include copper or any metal or alloy with sufficient conductive properties. The metal is typically applied by conventional electroplating, seed electroplating, metal vapor deposition, or any other method providing a uniform metal layer. The thickness of the metal layer is typically about 5 to 50 microns.

To enhance the adhesion of the metal layer to the dielectric coating, prior to the metallization step all surfaces are preferably treated with ion beam, electron beam, corona discharge or plasma bombardment followed by application of an adhesion promoter layer to all surfaces. The surfaces may alternatively be chemically or mechanically treated such as by chemical etching or microroughening as known to those skilled in the art prior to application of an adhesion promoter layer. The adhesion promoter layer is about 50 to 5000 Ångstroms thick and is typically a metal or metal oxide selected from one or more of chromium, titanium, nickel, cobalt, cesium, iron, aluminum, copper, gold, and zinc, and oxides thereof.

After metallization, a resinous photosensitive layer ("photoresist") is applied to the metal layer. Optionally, prior to application of the photoresist, the metallized substrate can be cleaned and pretreated; e.g., treated with an acid etchant to remove oxidized metal. The resinous photosensitive layer can be a positive or negative photoresist. The photoresist layer typically has a thickness of about 2 to 50 microns and can be applied by any method known to those skilled in the photolithographic processing art. Additive or subtractive processing methods may be used to create the desired circuit patterns.

Suitable positive-acting photosensitive resins include any of those known to practitioners skilled in the art. Examples include dinitro-benzyl functional polymers such as those disclosed in U.S. Pat. No. 5,600,035, columns 3–15. Such resins have a high degree of photosensitivity. In one embodiment, the resinous photosensitive layer is a composition comprising a dinitro-benzyl functional polymer, typically applied by spraying. Nitrobenzyl functional polymers as known to those skilled in the art are also suitable.

In a separate embodiment, the resinous photosensitive layer is an electrodepositable composition comprising a dinitrobenzyl functional polyurethane and an epoxy-amine polymer such as that described in Examples 3–6 of U.S. Pat. No. 5,600,035.

Negative-acting photoresists include liquid or dry-film type compositions. Liquid compositions may be applied by rolling application techniques, curtain application, or electrodeposition. Preferably, liquid photoresists are applied by electrodeposition, more preferably cationic electrodeposition. Electrodepositable compositions comprise an ionic, polymeric material which may be cationic or anionic, and may be selected from polyesters, polyurethanes, acrylics, and polyepoxides. Examples of photoresists applied by anionic electrodeposition are shown in U.S. Pat. No. 3,738, 835. Photoresists applied by cationic electrodeposition are described in U.S. Pat. No. 4,592,816. Examples of dry-film photoresists include those disclosed in U.S. Pat. Nos. 3,469, 982, 4,378,264, and 4,343,885. Dry-film photoresists are typically laminated onto the surface such as by application of hot rollers.

Note that after application of the photosensitive layer in step (e), the multi-layer substrate may be packaged at this point allowing for transport and processing of any subsequent steps at a remote location.

In a separate embodiment of the invention, after the photosensitive layer is applied in step (e), a photo-mask having a desired pattern may be placed over the photosensitive layer as in step (f) and the layered substrate exposed to a sufficient level of a suitable actinic radiation source as in step (g). As used herein, the term "sufficient level of actinic radiation" refers to that level of radiation which polymerizes the monomers in the radiation-exposed areas in the case of negative acting resists, or which depolymerizes the polymer or renders the polymer more soluble in the case of positive acting resists. This results in a solubility differential between the radiation-exposed and radiation-shielded areas.

The photo-mask may be removed after exposure to the radiation source and the layered substrate developed using conventional developing solutions to remove more soluble portions of the photosensitive layer, and uncover selected areas of the underlying metal layer as recited in step (h).

The metal uncovered during step (h) may then be etched using metal etchants that convert the metal to water-soluble metal complexes. The soluble complexes may be removed by water spraying.

The photosensitive layer protects any metal thereunder during the etching step (i). The remaining photosensitive layer, which is impervious to the etchants, may then be removed as in step (j) by a chemical stripping process to provide a circuit pattern connected by the metallized vias formed in step (d).

The total thickness of the multi-layer circuit assembly after removal of the photosensitive layer is typically about 25 to 360 microns, preferably 35 to 210 microns.

After preparation of the circuit pattern on the multi-layered substrate, other circuit components may be attached to form a circuit assembly, in a subsequent step (k). Additional components include one or more multi-layer circuit assemblies prepared by the process of the present invention, smaller scale components such as semiconductor chips, interposer layers, larger scale circuit cards or mother boards and active or passive components. Note that interposers used in the preparation of the circuit assembly may be prepared using appropriate steps of the process of the present invention. Components may be attached using conventional adhesives, surface mount techniques, wire bonding or flip chip techniques. High via density in the multi-layer circuit assembly prepared in accordance with the present invention allows for more electrical interconnects from highly functional chips to the packages in the assembly.

We claim:

1. A process for fabricating a multi-layer circuit assembly comprising the following steps:
   (a) providing a perforate electrically conductive core having a via density of 500 to 10,000 holes/square inch (75 to 1550 holes/square centimeter);
   (b) applying a dielectric coating onto all exposed surfaces of the electrically conductive core to form a conformal coating on all exposed surfaces of the electrically conductive core;

(c) ablating the surface of the dielectric coating in a predetermined pattern to expose sections of the electrically conductive core;

(d) applying a layer of metal to all surfaces to form metallized vias through the electrically conductive core; and (e) applying a resinous photosensitive layer to the metal layer.

2. The process of claim 1 wherein the electrically conductive core is a metal core selected from perforate copper foil, iron-nickel alloys, and combinations thereof.

3. The process of claim 2 wherein the metal core is a nickel-iron alloy.

4. The process of claim 3 wherein before application of the dielectric coating a layer of copper metal is applied to the metal core.

5. The process of claim 1 wherein the dielectric coating is applied by vapor deposition.

6. The process of claim 5 wherein the dielectric coating is a poly (para-xylylene).

7. The process of claim 1 wherein the dielectric coating is applied by electrodeposition.

8. The process of claim 1 wherein prior to step (d) all surfaces are treated with ion beam, electron beam, corona discharge or plasma bombardment followed by application of an adhesion promoter layer to all surfaces.

9. The process of claim 8 wherein the adhesion promoter layer is a metal or metal oxide selected from one or more of chromium, titanium, nickel, cobalt, cesium, iron, aluminum, copper, gold, zinc, and oxides thereof.

10. The process of claim 1 wherein the layer of metal applied in step (d) is a layer of copper.

11. The process of claim 1 wherein the resinous photosensitive layer applied in step (e) is a positive-acting photosensitive layer applied by electrodeposition.

12. The process of claim 1 wherein the perforate electrically conductive core has a via density of 2500 holes/square inch (387.5 holes/square centimeter).

13. A process for fabricating a multi-layer circuit assembly comprising the following steps:

(a) providing a perforate electrically conductive core having a via density of 500 to 10,000 holes/square inch (75 to 1550 holes/square centimeter);

(b) applying a dielectric coating onto all exposed surfaces of the electrically conductive core to form a conformal coating on all exposed surfaces of the electrically conductive core;

(c) ablating the surface of the dielectric coating in a predetermined pattern to expose sections of the electrically conductive core;

(d) applying a layer of metal to all surfaces to form metallized vias through the electrically conductive core;

(e) applying a resinous photosensitive layer to the metal layer;

(f) placing a photo-mask having a desired pattern over the photosensitive layer to form a layered substrate with selected exposed portions;

(g) exposing the layered substrate to a suitable actinic radiation source;

(h) removing the photo-mask and developing the layered substrate to remove more soluble portions of the photosensitive layer from the underlying metal layer and to uncover selected areas of the metal layer;

(i) etching any uncovered metal to remove it from the underlying dielectric coating; and (j) stripping the remaining resinous photosensitive layer to provide a circuit pattern connected by the metallized vias.

14. The process of claim 13 further comprising the step of:

(k) attaching other circuit components.

15. The process of claim 14 wherein the assembly is packaged after step (e) allowing for transport and subsequent processing of steps (f) through (k) at a remote location.

16. The process of claim 13 wherein the perforate electrically conductive core has a via density of 2500 holes/square inch (387.5 holes/square centimeter).

17. The process of claim 13 wherein the electrically conductive core is a metal core selected from perforate copper foil, iron-nickel alloys, and combinations thereof.

18. The process of claim 17 wherein the metal core is a nickel-iron alloy.

19. The process of claim 18 wherein before application of the dielectric coating a layer of copper metal is applied to the metal core.

20. The process of claim 13 wherein the dielectric coating is applied by vapor deposition.

21. The process of claim 20 wherein the dielectric coating is a poly (para-xylylene).

22. The process of claim 13 wherein the dielectric coating is applied by electrodeposition.

23. The process of claim 13 wherein prior to step (d) all surfaces are treated with ion beam, electron beam, corona discharge or plasma bombardment followed by application of an adhesion promoter layer to all surfaces.

24. The process of claim 23 wherein the adhesion promoter layer is a metal or metal oxide selected from one or more of chromium, titanium, nickel, cobalt, cesium, iron, aluminum, copper, gold, zinc, and oxides thereof.

25. The process of claim 13 wherein the layer of metal applied in step (d) is a layer of copper.

26. The process of claim 13 wherein the resinous photosensitive layer applied in step (e) is a positive-acting photosensitive layer applied by electrodeposition.

* * * * *